United States Patent [19]

Hladovcak et al.

[11] Patent Number: 4,487,828
[45] Date of Patent: Dec. 11, 1984

[54] METHOD OF MANUFACTURING PRINTED CIRCUIT BOARDS

[75] Inventors: Raymond C. Hladovcak, Seneca; Walter W. Keating, Oswego, both of Ill.

[73] Assignee: AT&T Technologies, Inc., New York, N.Y.

[21] Appl. No.: 500,681

[22] Filed: Jun. 3, 1983

[51] Int. Cl.³ .............................................. B05D 3/06
[52] U.S. Cl. ................................ 430/313; 156/659.1; 156/661.1; 427/54.1; 427/96; 427/270
[58] Field of Search ................ 427/54.1, 96, 270, 271, 427/272; 156/659.1, 661.1; 430/313

[56] References Cited

U.S. PATENT DOCUMENTS

| | | |
|---|---|---|
| 3,266,125 | 8/1966 | Tobolski . |
| 3,565,707 | 2/1971 | Radimer et al. ................ 156/659.1 |
| 3,574,933 | 4/1971 | Cassingham et al. . |
| 3,589,004 | 6/1971 | Shaheen . |
| 3,607,474 | 9/1971 | Hensdale ......................... 156/659.1 |
| 3,677,849 | 7/1972 | Brindisi et al. ...................... 156/345 |
| 3,778,900 | 12/1973 | Haining et al. . |
| 4,104,111 | 8/1978 | Mack . |
| 4,229,879 | 10/1980 | Lindebrings et al. . |
| 4,283,480 | 8/1981 | Davies et al. ..................... 427/54.1 |
| 4,325,780 | 4/1982 | Schulz . |

FOREIGN PATENT DOCUMENTS

| | | |
|---|---|---|
| 2614059 | 6/1977 | Fed. Rep. of Germany . |
| 46-37977 | 7/1971 | Japan . |
| 47-43908 | 11/1972 | Japan . |
| 5505877 | 8/1973 | Japan . |
| 53142337 | 5/1977 | Japan . |
| 1396481 | 6/1975 | United Kingdom . |

OTHER PUBLICATIONS

Huopana, *IBM Tech. Disc. Bull.*, vol. 1, #5, Feb. 1959, p. 36.
Villanuci et al., "Electronic Techniques" Prentice-Hall Inc., Englewood Cliffs, N.J., pp. 283-293.

*Primary Examiner*—John H. Newsome
*Attorney, Agent, or Firm*—R. F. Kip, Jr.

[57] ABSTRACT

A method for manufacturing a printed wiring board having a solder layer existing on circuit paths located on surfaces of the board and a solder layer on the walls of thru holes located in the board involves coating the surface of the board with a layer of photopolymer resist. A shield is placed over selected areas of the solder layer on the surface and the shielded surface is exposed to ultra violet light until the unshielded resist hardens. The shielded resist which has remained soft is removed and the board is washed with solder resist to remove the solder layer not covered by a coating of hardened resist.

2 Claims, 4 Drawing Figures

METHOD OF MANUFACTURING PRINTED CIRCUIT BOARDS

FIELD OF INVENTION

This invention relates to methods of manufacturing printed circuit boards and in particular to a method of manufacturing fine line printed wiring boards.

BACKGROUND OF THE INVENTION

Printed circuit boards are almost universally used in the electronics industry to mount electrical components and to interconnect these components by means of copper conductor paths printed, or laid, on the board surface. As components are being created which perform more functions while also designed in more compact arrangements thus allowing more components to be positioned on a board surface, the number of copper conductor paths, or traces, required to operate these miniaturized powerful components has not only grown substantially, but the path layouts have also become more complex. Printed circuit board manufacturers have attempted to meet these design demands for more component circuit configurations per board by incorporating new manufacturing techniques which have permitted thinner copper conductors to be laid on the board surface. These printed wiring boards having thinner conductors, also known as fine lines, allow higher densities of conductors to be applied to a board surface by laying conductors having a width of 0.0125" (31.7 mm) or less between conductors. Another technique used to increase the number of circuit configurations per board is to place circuits on each side of the board and to use plated-thru holes as conductor paths between the two sides. To use plated-thru holes as conductors, or as component lead receptacles, it is necessary that a solder compatible material, perferably solder itself, be plated on the walls of the holes and on adjacent terminal pad areas. For this to be done reliably, the usual method has been to apply solder to all areas of the copper conductor traces on both sides of the board and this includes both the thru-hole traces and the fine line conductor traces or paths.

However problems arise after components have been inserted into the fine line circuit board and it is passed through a soldering station, such as a solder wave bath. Heat from the soldering operation causes the solder layer on the fine line conductor paths to melt and flow to form short circuits with adjacent conductor paths. In the past, to prevent the solder from melting and flowing, the boards have been treated with a gelatinous mixture called solder mask. To operate effectively, the solder mask must completely cover each conductor path and also cover the board surfaces between the paths to inhibit solder flow between the paths. However, when the soler mask is applied to boards having fine line conductor paths, the space between the paths is so narrow that the gelatinous fluid can not flow down between the conductor paths to cover the interpath board surface but instead either forms a bridge between the paths and over the interpath surface, or is missing entirely from the interpath surface. Thus when the board is passed through the solder station the solder layer on the conductor path becomes heated and flows under the bridge of soldermask or across the non covered interpath surface to effect a short circuit between adjacent paths. Since this prior art method does not prevent solder short circuits, some manufacturers have had to resort to manual final inspection and solder touch up which is costly and time consuming.

There is a need therefore for a method of manufacturing printed wiring boards which prevents short circuits from forming between conductor paths.

SUMMARY OF THE INVENTION

The foregoing problem is solved by the present invention in which during an improved method of manufacturing a printed circuit board wherein the surface of the board has areas covered by a solder layer, an additional layer of photopolymer resist is applied to the surface of the board. Next a shield is placed over selected portions of the layer of resist covering some of the solder areas and the surface is then exposed to ultra violet light until the unshielded portions of the layer of resist hardens. The surface of the board is then washed to remove the unhardened photopolymer resist and the solder layer not covered by the hardened resist is then removed.

In a further step, the hardened photopolymer resist is washed from the surface by dipping the board into a bath of methylene chloride.

In one embodiment of the invention the printed circuit board has thru holes located in the board. The thru holes and areas adjacent the thru holes are coated with solder and the applied layer of photopolymer resist covering the thru holes and adjacent areas is not shielded from the ultra violet light during exposure to the ultra violet light such that the resist in the nonshielded areas becomes hard. After removing the shielded, or soft resist, the board is dipped into a bath of solder strip to wash away the solder not covered by hardened resist. The hardened resist is then removed leaving solder only on the walls of the thru holes and adjacent land areas.

BRIEF DESCRIPTION OF THE DRAWINGS

Other features and advantages of the invention will be more readily understood from the following detailed description when read in conjunction with the accompanying drawings, in which.

DETAILED DESCRIPTION

Figure 1:
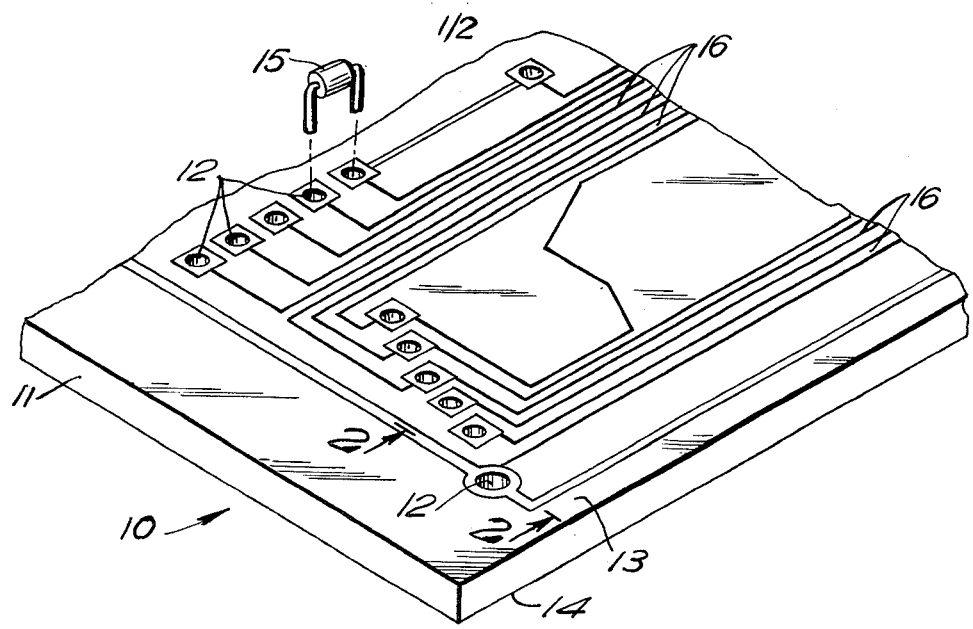
FIG. 1 is a perspective view of a printed circuit board.

FIG. 1 shows a printed wiring board 10 having a substrate member 11 into which are drilled a plurality of thru holes 12 extending between top surface 13 and bottom surface 14 of the substrate. Thru holes 12 can serve either of two purposes: they can provide a means for extending an electrical connection from a circuit pattern on the top surface 13 to a circuit pattern located on bottom side 14 of board 10; or they can serve as receptacles and electrical contacts for inserted leads of a component 15 which is to be mounted on the board. To serve either purpose the walls of thru holes 12 must be placed with a material, typically solder, which exhibits good electrical conductivity.

Also positioned on the surface 13 and 14 of substrate 11 are circuit patterns including conductor paths 16 constituting parts or all of the shown fine line conductors and adapted for providing electrical connection among various locations on the surfaces.

Figure 2:
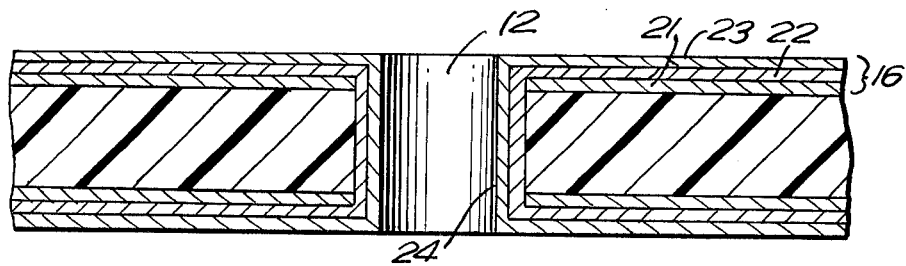
FIG. 2 is an enlarged cutaway section of the circuit board taken along lines 2—2 of FIG. 1 showing the various layers of material on the surface of the board.

One method of manufacturing a printed wiring board 10 uses a substrate 11, typically made of epoxy coated glass, on which a copper foil layer 21 is affixed to each surface 13 and 14 as seen in FIG. 2. A substrate of this type can be purchased from Westinghouse Inc. of Hampton, S.C. as the FR4 copper clad material. Substrate 11 is then placed in a drilling machine and thru holes 12 are drilled at precise locations. After deburring drilled holes 12 and cleaning surfaces 13 and 14, circuit path configurations 16 are applied to selected land areas of surfaces 13 and 14 by any well known manufacturing process.

One such process involves dipping substrate 11 into a bath of ammonium persulfate to partially etch copper foil layer 21 after which the substrate is cleaned by dipping it into sulfuric acid. The partially etched and cleaned substrate 11 is then placed in a bath of hydrochloric acid which acts to condition the copper surfaces 21 to accept a coating of tin-palladium when substrate 11 is next dipped into a bath of tin-palladium colloid. After rinsing substrate 11 it is now placed into an accelerator such as fluboric acid to remove the tin from the tin-palladium coating and expose the palladium. Substrate 11, with an exposed coating of palladium, is next dipped into an electroless copper bath, typically a solution of sodium hydroxide, copper sulfate, formaldehyde and ethylene diaminetetra acetic acid. ($N_aOH$, $C_uSO_4$, CHO, and E.D.T.A.), where the palladium acts as a catalyst for accelerating the adherence of copper onto surfaces 13 and 14 of substrate 11.

Surfaces 13 and 14 of substrate 11 are now coated with a layer 22 of copper typically 50 micro inches thick. The thickness of copper layer 22 is directly related to the amount of time that substrate 11 is suspended in the electroless copper bath, the more time substrate 11 is immeresed in the bath the thicker layer 22 becomes. Next a laminate dry film of photo-sensitive polymer material is applied to each surface 13, 14 on which copper layer 22 has been applied. One of the surfaces, surface 13 of substrate 11 is now exposed to ultra-violet light through a mask, typically a film art master, to delineate catalytic metal deposition sites at the exposed areas. The film art master has located on one of its surfaces darkened land areas, or opaque sections, representing the outline of the circuit path configuration which is to be exposed on to the photo-sensitive coated surface 13 by exposure to the ultra-violet light. The ultra-violet light causes the positions of the photo sensitive coating which are exposed to become hard; the portions of the photo-sensitive layer which become hard outline the circuit patterns which will remain on board surface 13. Next the above steps are performed on surface 14, that is a photo-sensitive layer is applied to surface 14 and then exposed to ultra-violet light through a mask to delineate circuit path patterns on surface 14. In some manufacturing processes surfaces 13 and 14 are simultaneously laminated and simultaneously exposed to ultra-violet light instead of sequentially.

After exposure of surfaces 13 and 14 to ultra-violet light, substrate 11 is placed in a bath of 1-1-1trichloroethane developer to remove the unexposed, or soft, photo-sensitive polymer. Substrate 11, after washing, is then dipped into a copper electro-plating bath to build a 1 mil inch thick copper trace 22 on the circuit paths 16 and into a solder electro-plating bath to build a 0.3 mil thick coating of solder 23 on the copper trace 22. Substrate 11 is next placed into a bath of solvent, typically methylene chloride, to remove the hardened photo-sensitive layer and then into a bath of alkaline type etchant to etch or remove the unwanted exposed layer of copper foil from surfaces 13 and 14. The coating of solder 23 acts as an etchant resist to prevent the copper traces 22 from being attacked by the etchant.

FIG. 2 is an end view of a substrate 11 with the depicted dimensions exaggerated, particularly the thickness of the various layers on substrate 11 and the width of thru hole 12. As seen in FIG. 2, substrate 11 has placed on surfaces 13 and 14 and on wall 24 of thru hole 12 a layer of copper foil 21, a layer of electro-plated copper 22 and a layer of electro-plated solder 23. If components are inserted into thru holes 12 on substrate 11 and substrate 11 is then passed thru a solder wave bath, solder layer 23 becomes sufficiently heated to melt and form a short circuit between adjacent conductor paths 16. To prevent these unwanted short circuits from occurring, substrate 11 is moved through the sequence of processing steps shown in FIG. 3.

In step 31, substrate 11 is coated with a photopolymer resist and a phototool, which is essentially a shield or screen, placed over each of surfaces 13 and 14 (step 32) prior to exposing the surfaces to ultra-violet light (step 33). The phototool, typically a film art master, has located on one of its surfaces darkened land areas, or opaque sections, which block the passage of light therethrough. Opaque sections are positioned to prevent the photopolymer resist coating, which is covering the solder on the circuit traces, from being exposed to light when the art master is placed over the surface. Substrate 11 is exposed to ultra-violet light having a minimum energy of 80 millijoules/CM2 at 365 nanometers or until the exposed coating of photopolymer resist hardens. The ultra-violet light hardens the resist covering the solder in and adjacent to thru holes 12 (FIG. 1) while the resist covering the circuit paths 16 remains soft.

Figure 3:
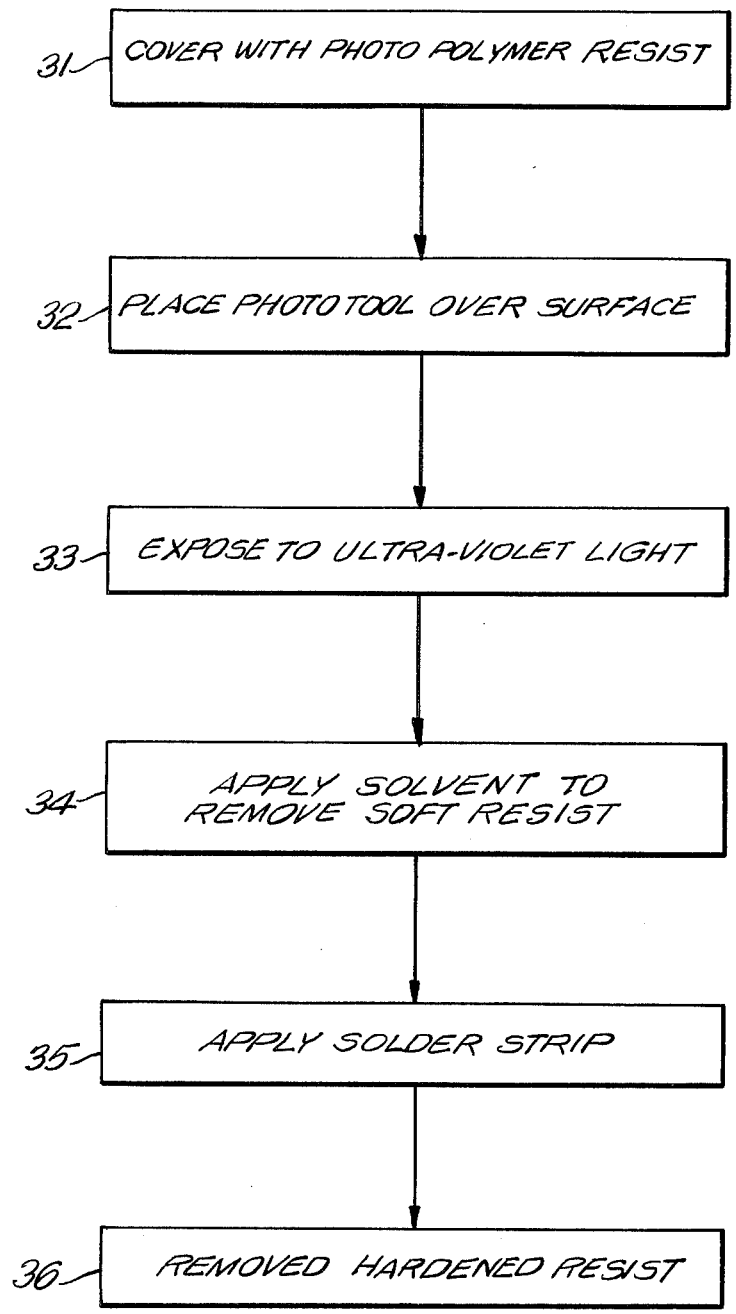
FIG. 3 is a flow chart type of table showing the sequence of processing steps of the present invention.

Substrate 11, having a hardened resist coating 26 over solder traces in and around thru holes 12 and a softened resist coating over circuit traces 16, is now placed in a solvent bath where the solvent is typically 1-1-1trichloroethane as seen in step 34 of FIG. 3. The solvent removes the soft resist thereby leaving solder traces 23 on the circuit paths bare. Next, substrate 11 is dipped into a bath of solder strip, typically containing fluoride, to remove the solder traces from the circuit paths (step 35). After removal from the solder strip bath, the hardened polymer resist located on and adjacent to the thru holes 12 is removed by washing substrate 11 in a methylene chloride bath as seen in step 36.

Figure 4:
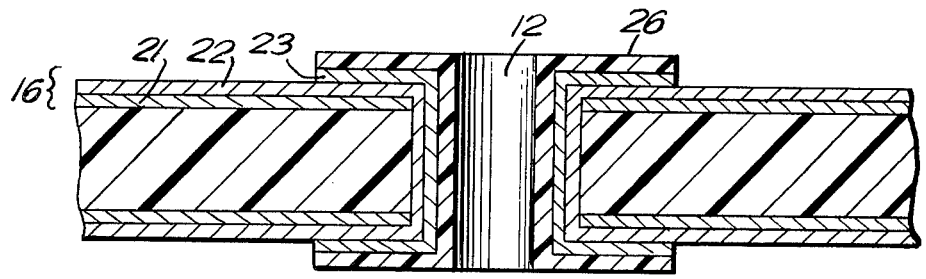
FIG. 4 is a cutaway section similar to FIG. 2 but showing the layers of material existing on the surface of the board after processing the board by means of the inventive method shown in FIG. 3.

Substrate 11 now has solder traces in and around thru holes 12 with no solder traces covering circuit paths 16 as seen in FIG. 4. After a solder mask is applied to circuit paths 16 components can now be placed on printed wiring board 10 and the board moved through a solder wave bath without any short circuits formed between adjacent circuit paths 16 by melted solder since the solder has been removed from the circuit paths and the solder mask prevents new solder from adhering to the paths.

It will also be apparent that one skilled in the art may make various modifications and changes to the apparatus disclosed herein without departing from the spirit and scope of this invention.

What is claimed is:

1. The method of manufacturing a printed circuit board comprising the steps of:

(a) processing an insulative substrate (1) to form on a surface of such substrate on one side thereof a plurality of fine line conductor paths, and terminals pads therefor, in such manner that said paths are separated by narrow interpath areas of such surface, and that both said paths and said pads comprise inner and outer layers of copoper and solder, respectively, and (2) to further form in said substrate a plurality of through holes in centered relation with said pads and having on the sides of their interiors said inner and outer layers of copper and solder, (b) coating said substrate on said side thereof with photopolymer resist so as to cover by such resist all of said pluralities of paths, pads and holes, (c) exposing to energetic radiation only portions of the resist coating which are on said pads and holes, so as to harden only those resist portions, (d) removing the unhardened resist so as to leave bare said conductor paths, (e) applying a liquid solder stripping medium to said substrate so as to strip from said circuit paths the solder layer thereof without removal of the copper layer thereof, and (f) after termination of said stripping step, removing said hardened resist portions so as to leave bare the solder layer areas of said pads and holes which were previously covered by said hardened portions.

2. The method of manufacturing a printed circuit board according to claim 1 comprising the further steps of:

(g) coating said solder-free copper conductive paths with a solder mask material, (h) inserting component leads in the solder-coated through holes, and (i) passing the component bearing printed wiring board through a wave soldering station, so as to couple such leads by solder to said prexisting solder layer areas on said pads and in said holes.

* * * * *